(12) United States Patent
Blon

(10) Patent No.: US 7,466,199 B2
(45) Date of Patent: Dec. 16, 2008

(54) LOW NOISE AMPLIFIER WITH LOW CURRENT CONSUMPTION

(75) Inventor: Thomas Blon, Jengen (DE)

(73) Assignee: National Semiconductor Germany AG, Unterhaching (DE)

( * ) Notice: Subject to any disclaimer, the term of this patent is extended or adjusted under 35 U.S.C. 154(b) by 98 days.

(21) Appl. No.: 11/732,567

(22) Filed: Apr. 4, 2007

(65) Prior Publication Data

US 2008/0024224 A1  Jan. 31, 2008

(30) Foreign Application Priority Data

Apr. 5, 2006 (DE) ........................ 10 2006 015 983

(51) Int. Cl.
H03F 3/45 (2006.01)
(52) U.S. Cl. ................... 330/255; 330/260; 330/263
(58) Field of Classification Search ............ 330/86, 330/252, 253, 260–265, 267, 282, 291, 300
See application file for complete search history.

(56) References Cited

U.S. PATENT DOCUMENTS

| | | | | |
|---|---|---|---|---|
| 5,489,876 | A | * | 2/1996 | Pernici ....................... 330/253 |
| 5,917,379 | A | * | 6/1999 | Ashby et al. ................ 330/260 |
| 6,118,340 | A | * | 9/2000 | Koen .......................... 330/260 |
| 6,573,784 | B2 | | 6/2003 | Gower et al. |

FOREIGN PATENT DOCUMENTS

WO  WO 2005/029711 A2  3/2005

* cited by examiner

*Primary Examiner*—Khanh V Nguyen
(74) *Attorney, Agent, or Firm*—Pearne & Gordon LLP

(57) ABSTRACT

The invention relates to an amplifier circuit comprising supply terminals (12, 14) for supplying the circuit with first and second supply potentials (Vdd, Vss); a current path, which runs from the first supply terminal (12) via a first biased transistor (P1a, P1b), a first node (K1a, K1b), an input transistor (Q1a, Q1b), a second node (K2a, K2b) and a second biased transistor (N1a, N1b) to the second supply terminal (14), wherein a control terminal of the input transistor is loaded with an input signal (inp-inn), and wherein the second node (K2a, K2a) forms a pick-up in a resistor chain (R2a, R1, R2b), at whose ends is supplied an output signal (outp-outn) as a voltage drop; and a feedback stage enabling the current to flow the resistor chain (R2a, R1, R2b) dependent on the input signal (inp-inn) so that the current flowing through the input transistor (Q1a, Q1b) is essentially independent of the input signal (inp-inn), wherein the feedback stage has a pair of complementarily coupled transistors (P3a, N3a, P3b, N3b) with an intervening current output node (K3a, K3b). To increase the scope of application of such an amplifier and achieve a low noise amplification at a low current consumption, provision is made, according to the invention, for the complementarily coupled transistors (P3a, N3a, P3b, N3b) to be designed as FETs and the first node (K1a, K1b) to be connected on the one hand via a third biased transistor (N2a, N2b) to the second supply terminal (14) and on the other hand to a gate terminal of one (N3a, N3b) of the complementarily coupled transistors (P3a, N3a, P3b, N3b).

9 Claims, 1 Drawing Sheet

LOW NOISE AMPLIFIER WITH LOW CURRENT CONSUMPTION

BACKGROUND OF THE INVENTION

1. Field of the Invention

This invention relates to an amplifier circuit for amplifying an input signal and transmitting the amplified signal as an output signal, comprising:

a first supply terminal and a second supply terminal for supplying the circuit with a first supply potential and a second supply potential respectively, at least one current path which runs from the first supply terminal via a first biased transistor, a first circuit node, an input transistor, a second circuit node and a second biased transistor to the second supply terminal, wherein a control terminal of the input transistor is loaded with the input signal, and wherein the second circuit node forms a pick-up in a resistor chain at whose ends the output signal is supplied as a voltage drop, and a feedback stage for enabling the current to flow through the resistor chain dependent on the input signal so that the current flowing through the input transistor is essentially independent of the input signal, where the feedback stage has a pair of transistors coupled for complementary operation with an intermediate output node for transmitting the current.

2. Description of the Prior Art

Such an amplifier circuit is disclosed, for example, in WO 2005/029711 A2. FIG. 7 of this publication, for example, shows an amplifier circuit constructed symmetrically of two amplifier branches for amplifying a differential input signal (input potentials INP, INL) and transmitting the amplified signal as a differential output signal (output potentials OPH, OPL). The amplifier circuit is supplied by means of a first supply potential Vpos and a second supply potential COM.

The amplifier branch shown in the left-hand part of the figure comprises a current path running from the first supply potential $V_{POS}$ via an input transistor Q15 to the second supply potential COM, wherein a control terminal of the input transistor is loaded with one of the input potentials and wherein the emitter of the input transistor is connected to a pick-up in a resistor chain R2, R1, R3 to whose ends the output signal is supplied as a voltage drop.

The circuit part shown in the figure to the left of this current path forms a feedback stage enabling the current to flow through the resistor chain dependent on the input signal so that the current flowing through input transistor Q15 is essentially independent of the input signal. A certain working point of the input transistor is therefore advantageously retained in the operation of the amplifier. The current required to enable it to flow through the resistor chain is supplied to a pair of transistors Q6, Q7 coupled for complementary operation with an intervening output node connected to the resistor chain.

SUMMARY OF THE INVENTION

The amplifier circuit of prior art suffers from a number of disadvantages.

A first disadvantage consists in the fact that the amplifier circuit of prior art makes difficult so-called high integration in larger components due to the use of bipolar transistors, components which are preferably produced in CMOS-technology because of larger digital circuits. A conceivable combination of the bipolar amplifier circuit with digital CMOS circuits, in BiCMOS-technology, would be associated with considerable production costs.

A further advantage of the amplifier circuit of prior art is its comparatively high supply voltage required for operation (difference between the supply potentials). The trend is towards increasingly low supply voltages, particularly in the case of integrated circuits.

Finally, the amplifier circuit of prior art produces a comparatively high power dissipation.

An object of this invention is to develop further an amplifier circuit of the type mentioned so that its scope of application is extended and so that, in particular, low noise amplification with low current consumption can be achieved simultaneously.

This object is achieved with an amplifier circuit, characterized in that the two complementarily coupled transistors of the feedback stage are designed as FETs, and in that the first circuit node is connected on the one hand via a third biased transistor to the second supply terminal, and on the other to a gate terminal of one of the two complementarily coupled transistors. The dependent claims relate to advantageous further developments of the invention.

In the amplifier circuit of the invention provision is made for the two complementarily coupled transistors of the feedback stage to be designed as FETs (field effect transistors), and for the first circuit node to be connected via a third biased transistor to the second supply terminal on the one hand, and to a gate terminal of one of the two complementarily coupled transistors on the other.

The design of the complementarily coupled transistors as FETs simplifies the integration of the amplifier circuit in an integrated circuit arrangement produced in CMOS-technology. Furthermore, the nature of the connection of the current path to the feedback stage allows a considerable reduction in the required voltage as well as of the current consumption.

In a particular embodiment provision is made for the first and second biased transistors to be designed as FETs of different conductivity type. It is also preferable here for one of the two channel terminals of these transistors to be connected directly to the appropriate supply terminal, whereas the other two channel terminals of these transistors are connected directly to the input transistor.

It is preferable, particularly if the first and second biased transistors are designed as FETs of different conductivity type, for the third biased transistor also to be formed by an FET which has the same conductivity type as the second biased transistor.

In an advantageous further development provision is made for the connection of the first circuit node to the third biased transistor and to the gate terminal of the coupled transistor to run via a fourth biased transistor. This fourth biased transistor may also be formed by an FET which preferably has the same conductivity type as the first biased transistor.

The biasing of the transistors mentioned will mean that their control inputs are loaded with a setting potential that is essentially independent of the input signal, which potential is preferably provided as a fixed predetermined setting potential and may be derived, for example, from the two supply potentials as a potential lying between these supply potentials.

It is possible to design all the transistors of the amplifier circuit as FETs (e.g. MOS-FETs) and, in particular, to construct the amplifier circuit as a pure CMOS circuit. Ion such an embodiment provision is made, for example, for the first biased transistor, the fourth biased transistor provided if necessary, and the input transistor to be designed as NMOS transistors and the second biased transistor to be designed as a PMOS transistor. Alternatively the opposite types (PMOS instead of NMOS and vice versa) may be provided for these transistors.

In a preferred embodiment, however, the input transistor is designed as a bipolar transistor, in which case, as a further preference, at least some or all the other transistors are designed as FETs, particularly in CMOS-technology.

In this connection it is worth mentioning that a bipolar transistor that meets the requirements of the input transistor is also available to a certain extent as a "parasitic element" in MOS processes, particularly in MOS processes with comparatively small structure widths. The essential advantage of using a bipolar transistor as input transistor is that a transconductance (required for reducing white noise) can be achieved with a much lower transistor current. Moreover, the 1/f noise of a bipolar transistor is at this point much lower than that of an MOS transistor.

Preference is given to the two complementarily coupled FETs of different conductivity type, where, in further preference, one of the two channel terminals is connected directly to the appropriate supply terminal and the other two channel terminals are connected directly to the output node of this complementary pair.

In a particularly universally applicable embodiment the amplifier circuit is designed as a fully differential amplifier. For this purpose the amplifier circuit may comprise two symmetrically constructed amplifier paths in which the resistor chain forms a common part in the amplifier branch, where control terminals of the input transistors of the two amplifier branches are loaded with input potentials of the differentially supplied input signal, and where the output signal is supplied in differential form as a voltage drop to the common resistor chain.

In a preferred embodiment a supply voltage of less than 3V is provided.

A preferred application of the amplifier circuit according to the invention is its arrangement in an integrated circuit configuration in which the amplifier circuit is an analog-digital converter for converting the output signal to a digital signal downstream, and in which a digital signal processing device is in turn connected downstream from the analog-digital converter for processing the digital signal. Here the signal processing device may be formed from CMOS circuits and the amplifier circuit may also be produced in CMOS-technology (preferably with the exception of the input transistor).

The amplifier circuit of the invention may form a part (e.g. pre-amplifier) of a larger amplifier arrangement. In such an amplifier arrangement amplifier stages with an adjustable amplification (e.g. adjustable by means of a digital signal) may also be included.

In summary a universally applicable amplifier circuit is provided by the invention which also receives a low feed current even with low input noise. Because of the controlled mode of operation ("closed loop") high linearity of the amplification characteristic can be guaranteed, where the feedback stage of the amplifier circuit is able to guarantee this linearity with a suitably large loop amplification even with a high amplifier bandwidth (e.g. greater than 100 MHz). A high integration of the amplifier circuit is possible without problem.

BRIEF DESCRIPTION OF THE DRAWINGS

The invention is described in further detail in the following by means of an exemplary embodiment with reference to the attached drawing, in which.

DESCRIPTION OF THE PREFERRED EMBODIMENT(S)

Figure 1:
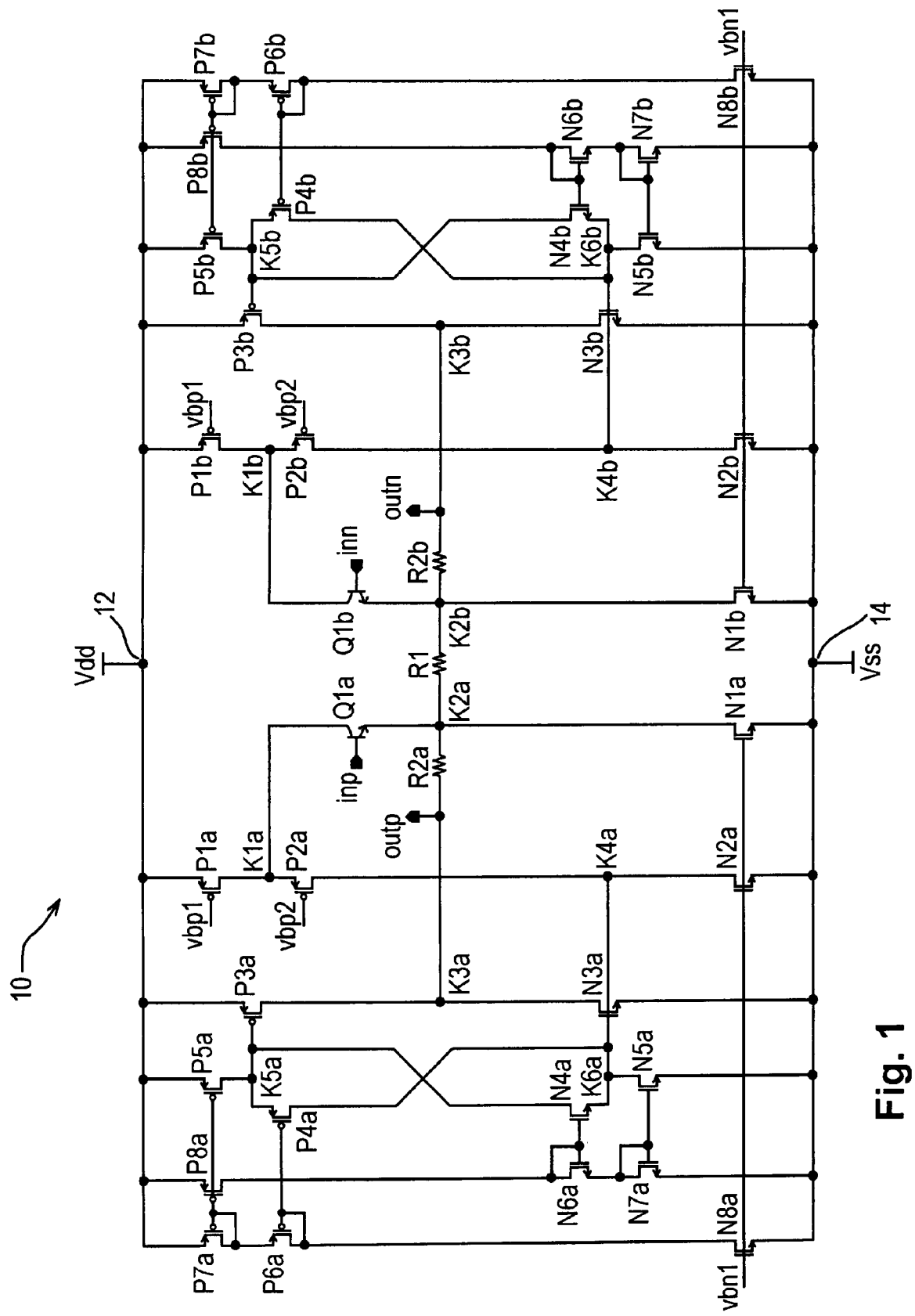
FIG. 1 shows a schematic of a fully differential amplifier designed according to the invention.

Amplifier 10 shown in FIG. 1 forms an analog circuit part of a larger integrated circuit arrangement fully integrated in CMOS-technology, which arrangement also has digital circuits (not shown).

Amplifier 10 is used for the linear amplification of a differential input signal (inp-inn) input as input potentials inp, inn, and for transmission of the amplified signal as a differential output signal (outp-outn) with output potentials outp, outn.

For this purpose amplifier 10 comprises two amplifier branches constructed symmetrically to each other (on the left and right in the figure), which branches are also supplied via a first supply terminal 12 with a first (positive) supply potential Vdd and via a second supply terminal 14 with a second (negative) supply potential Vss.

Because of the symmetrical structure an explanation of one of the two amplifier branches, of which only the left amplifier branch in the figure is described in detail in the following, by way of example, is sufficient for an understanding of the invention.

The left amplifier branch in the figure comprises the connections for supplying input potential inp and for transmitting output potential outp.

A current path runs from the first supply terminal 12 via a first biased transistor P1a, a first circuit node K1a, an input transistor Q1a, a second circuit node K2a and a second biased transistor N1a, to the second supply terminal 14. In the exemplary embodiment shown, the connections between the above-mentioned components are each provided directly (without the insertion of further elements).

The base terminal of input transistor Q1a, designed as an NPN transistor, is loaded with input potential inp. The second circuit node K2a forms a pick-up in a resistor chain of resistors R2a, R1, R2b. The pick-up is provided between resistors R2a and R1. As shown in the figure, output signal outp-outn is supplied as a voltage drop at the ends of the resistor chain.

All the components shown in the figure, whose reference symbols end with the letter "a", are assigned to the left amplifier branch, whereas the components belonging to the right amplifier branch have a reference symbol ending in the letter "b".

In the exemplary embodiment shown all transistors are designed as MOS transistors, apart from bipolar transistor Q1a (and its symmetrical counterpart Q1b), PMOS transistors (with conductivity type p) having a reference symbol starting with "P", whereas NMOS transistors (with conductivity type n) have a reference symbol starting with "N".

As will be also be explained below, a current which varies linearly with input signal inp-inn flows through resistor chain R2a, R1, R2b in the operation of the amplifier, and an output signal outp-outn varying linearly with the input signal is therefore generated. Here a current maintained independently of the input signal flows through input transistor Q1a, and the potential (emitter potential of input transistor Q1a) prevailing at node K2a follows the base potential of input transistor Q1a with a certain offset (base emitter voltage).

The feedback stage provided for this purpose comprises a pair of transistors P3a, N3a coupled to each other for the complementary operation, with an intermediate output node K3a for transmitting the current to the resistor chain.

A deviation path to the second supply terminal 14, which is formed from a series connection consisting of a fourth biased transistor P2a and a third biased transistor N2a, runs from node K1a parallel to transistors Q1a, N1a. Corresponding channel terminals of transistors P2a, N2a are connected directly to node K1a and supply terminal 14 respectively, whereas the other two channel terminals are connected directly to each other and to a fourth circuit node K4a, which node is in turn connected directly to the gate terminal of transistor N3a.

For example, if input potential inp on the base of transistor Q1a rises, this results in a tendential increase in the current flowing through this transistor. This in turn tendentially reduces the current which flows from node K1a via transistors P2a and N2a to supply terminal 14. This reduces the potential prevailing at node K4a and hence the gate terminal of transistor N3a, so that the current flowing through transistor N3a is reduced by a certain amount. The complementary coupling between N3a and P3a causes the current flowing through transistor P3a to be reduced by approximately the same amount. Consequently this complementary transistor pair P3a, N3a supplies to resistor chain R2a, R1, R2b, at output node K3a, a current whose value is essentially equal to twice the current variation amount mentioned.

The current flowing via the resistor chain and the voltage drop caused thereby at the individual resistors result in an increase in the potential prevailing at node K2a and hence the emitter of input transistor Q1a. The increase in potential at the emitter reduces the base emitter voltage, so that the processes described represent a control mechanism in which an increase in input potential inp actually results in an almost exactly the same increase in potential at node K2a since the loop reinforcement of the feedback stage (ratio of the potential variations at the base and at the emitter of input transistor Q1a) is far greater than 1.

In the right amplifier branch in the figure there is a corresponding control so that finally a fully differential output signal outp-outn with high linearity is supplied on the basis of the differentially inputted input signal inp-inn.

Each variation in the current ratios at node K1a is advantageously used very directly and without appreciable power requirement for activating the complementarily coupled transistor pair P3a, N3a.

The biasing of transistors P1a, N1a, N2a and P2a is achieved by setting potentials vbp1, vbp2 and vbn1, which are preferably provided as permanently predetermined potentials (between supply potentials Vdd and Vss). As shown in the figure, these setting potentials vbp1, vbp2 and vbn1 are also used for setting the corresponding biased transistors of the right amplifier branch in the figure.

There are a variety of possibilities of coupling transistor pair P3a, N3a. The extremely current-saving circuit part shown in the figure is described for this.

A path runs from the first supply terminal 12 via a transistor P5a to a circuit node K5a, which is connected to the gate terminal of transistor P3a. The path branches at this node K5a into a branch which runs via a transistor P4a and a branch which runs via a transistor N4a. Both branches again converge at a circuit node K6a which is connected to the gate terminal of transistor N3a. This node K6a is connected by a transistor N5a to the second supply terminal 14.

The gate terminals of transistors P5a, P4a, N4a and N5a are each loaded with a bias potential which is generated by a transistor arrangement P7a, P8a, P6a, N6a, N7a, N8a.

The invention claimed is:

1. An amplifier circuit for amplifying an input signal (inp-inn) and transmitting the amplified signal as an output signal (outp-outn), comprising:

a first supply terminal (12) and a second supply terminal (14) for supplying the circuit with a first supply potential (Vdd) and a second supply potential (vss) respectively, at least one current path which runs from the first supply terminal (12) via a first biased transistor (P1a, P1b), a first circuit node (K1a, K1b), an input transistor (Q1a, Q1b), a second circuit node (K2a, K2b) and a second biased transistor (N1a, N1b) to the second supply terminal (14), wherein a control terminal of the input transistor is loaded with the input signal (inp-inn), and wherein the second circuit node (K2a, K2b) forms a pick-up in a resistor chain (R2a, R1, R2b) at whose ends the output signal (outp-outn) is supplied as a voltage drop, and a feedback stage for enabling the current to flow through the resistor chain (R2a, R1, R2b) dependent on the input signal (inp-inn) so that the current flowing through the input transistor (Q1a, Q1b) is essentially independent of the input signal (inp-inn), where the feedback stage has a pair of transistors (P3a, N3a, P3b, N3b) coupled for complementary operation with an intermediate output node (K3a, K3b) for transmitting the current, characterized in that the two complementarily coupled transistors (P3a, N3a, P3b, N3b) of the feedback stage are designed as FETs, and in that the first circuit node (K1a, K1b) is connected on the one hand via a third biased transistor (N2a, N2b) to the second supply terminal (14), and on the other to a gate terminal of one (N3a, N3b) of the two complementarily coupled transistors (P3a, N3a, P3b, N3b).

2. The amplifier circuit according to claim 1, wherein the first (P1a, P1b) and second (N1a, N1b) biased transistors are designed as FETs of different conductivity type.

3. The amplifier circuit according to claim 1, wherein the third biased transistor (N2a, N2b) is of the same conductivity type as the second biased transistor (N1a, N1b).

4. The amplifier circuit according to claim 1, wherein the connection of the first circuit node (K1a, K1b) to the third biased transistor (N2a, N2b) and to the gate terminal of the coupled transistor (N3a, N3b) runs via a fourth biased transistor (P2a, P2b).

5. The amplifier circuit according to claim 1, wherein the input transistor (Q1a, Q1b) is designed as a bipolar transistor.

6. The amplifier circuit according to claim 1, wherein the two complementarily coupled transistors (P3a, N3a, P3b, N3b) are of different conductivity types.

7. The amplifier circuit according to claim 1, comprising two amplifier branches constructed symmetrically to each other, in which the resistor chain (R2a, R1, R2b) forms a common part of both amplifier branches, wherein control terminals of the input transistors (Q1a, Q1b) of the two amplifier branches are loaded with input potentials (inp, inn) of the differentially supplied input signal (inp-inn), and wherein the output signal (outp-outn) is supplied in differential form as a voltage drop at the common resistor chain (R2a, R1, R2b).

8. The amplifier circuit according to claim 1, wherein a supply voltage (Vdd-Vss) of less than 3V is provided.

9. An integrated circuit arrangement, comprising at least one amplifier circuit (10) according to claim 1, wherein the integrated circuit arrangement also has an analog-digital converter connected downstream from the amplifier circuit (10) for converting the output signal (outp-outn) to a digital signal and a digital signal processing device, connected downstream from the analog-digital converter, for processing the digital signal.

* * * * *